(12) United States Patent
Heo et al.

(10) Patent No.: US 9,030,274 B2
(45) Date of Patent: May 12, 2015

(54) FILTER ASSEMBLY

(71) Applicant: LSIS Co., Ltd., Anyang-si, Gyeonggi-do (KR)

(72) Inventors: Min Heo, Seoul (KR); Jun Seok Eom, Pyeongtaek-si (KR); Bo Hyun Youn, Seoul (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 40 days.

(21) Appl. No.: 13/972,717

(22) Filed: Aug. 21, 2013

(65) Prior Publication Data

US 2014/0062617 A1    Mar. 6, 2014

(30) Foreign Application Priority Data

Sep. 6, 2012   (KR) .................... 20-2012-0007952 U

(51) Int. Cl.
| | |
|---|---|
| *H03H 7/00* | (2006.01) |
| *H03H 7/01* | (2006.01) |
| *H05K 3/30* | (2006.01) |
| *H05K 3/32* | (2006.01) |
| *H05K 3/34* | (2006.01) |

(52) U.S. Cl.
CPC ................ *H03H 7/01* (2013.01); *H05K 3/328* (2013.01); *H05K 3/3447* (2013.01); *H05K 2201/1003* (2013.01); *H05K 3/306* (2013.01)

(58) Field of Classification Search
USPC .......................................... 333/185
See application file for complete search history.

(56) References Cited

U.S. PATENT DOCUMENTS

| | | | | |
|---|---|---|---|---|
| 5,982,603 | A * | 11/1999 | Choi ............................ | 361/119 |
| 2005/0197677 | A1 * | 9/2005 | Stevenson ....................... | 607/36 |
| 2013/0049550 | A1 * | 2/2013 | Watanabe et al. ........... | 310/67 R |
| 2013/0300520 | A1 * | 11/2013 | Horng et al. ................. | 333/185 |

FOREIGN PATENT DOCUMENTS

| | | |
|---|---|---|
| JP | 07-015269 | 1/1995 |
| KR | 10-2002-0042570 | 6/2002 |
| KR | 20-0412869 | 4/2006 |
| KR | 20120093477 | 8/2012 |

OTHER PUBLICATIONS

Korean Intellectual Property Office Application Serial No. 10-2012-0007952, Office Action dated Oct. 10, 2013, 4 pages.
Korean Intellectual Property Office Application Serial No. 20/2012-0007952, Notice of Allowance dated Mar. 3, 2014, 2 pages.

\* cited by examiner

*Primary Examiner* — William Hernandez
(74) *Attorney, Agent, or Firm* — Lee, Hong, Degerman, Kang & Waimey

(57) ABSTRACT

A filter assembly is provided. The filter assembly includes a printed circuit board (PCB) including a plurality of electronic components, a base disposed under the PCB, and an inductor coupled to the base, the inductor including a core and a coil to which current is applied, wherein the PCB has a through-hole through which at least one portion of the coil pass.

15 Claims, 5 Drawing Sheets

FILTER ASSEMBLY

CROSS-REFERENCE TO RELATED APPLICATIONS

Pursuant to 35 U.S.C. §119 (a), this application claims the benefit of earlier filing date and right of priority to Korean Patent Application No. 20-2012-0007952, filed on Sep. 6, 2012, the contents of which are hereby incorporated by reference in their entirety.

BACKGROUND

The present disclosure relates to a filter assembly including an inductor.

Filter assemblies are devices which remove noises and high frequencies from input signals of an applied power to provide the resultant input signals to a load. Such a filter assembly may include an inductor and a printed circuit board (PCB) on which various circuit components are mounted.

For example, the filter assembly may be used in electronic components of an electric vehicle, i.e., a charger or a low-voltage DC converter (LDC). In detail, the filter assembly may be a filter device disposed on a three-phase AC input terminal. Of cause, the filter assembly may be variously used in electrical devices including the inductor and the PCB in addition to the charger or the LDC.

In case of the filter assembly according to the related art, a structure for coupling the inductor to the PCB may be complicated.

In detail, the inductor is fixed to a base of the filter assembly through a separate fixing unit. A coil provided in the inductor is coupled to the PCB through a separate fixing member.

According to the assembly structure of the filter assembly, the separate fixing member for fixing the coil is needed. Since the coil is coupled to the PCB through the fixing member, the coil may be increased in length.

As a result, when the filter assembly is assembled, additional components may be needed, and the assembling process may be complicated to deteriorate assemblability. Also, costs required for assembling the filter assembly may be excessively increased.

SUMMARY

Embodiments provide a filter assembly having improved assemblability and reduced manufacturing costs.

In one embodiment, a filter assembly includes: a printed circuit board (PCB) including a plurality of electronic components; a base disposed under the PCB; and an inductor coupled to the base, the inductor including a core and a coil to which current is applied, wherein the PCB has a through-hole through which at least one portion of the coil pass.

In another embodiment, a filter assembly includes: an inductor including a core and a coil to which a current is applied, a base including a seating part on which the inductor is seated; a printed circuit board (PCB) disposed spaced upward from the base; a through-hole through which an end of the coil passes to extend upward, the through-hole being defined in the PCB, and a coupling part disposed in the through-hole to couple the coil to the PCB.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. The invention may, however, be embodied in many different forms and should not be construed as being limited to the embodiments set forth herein; rather, that alternate embodiments included in other retrogressive inventions or falling within the spirit and scope of the present disclosure will fully convey the concept of the invention to those skilled in the art.

Figure 1:
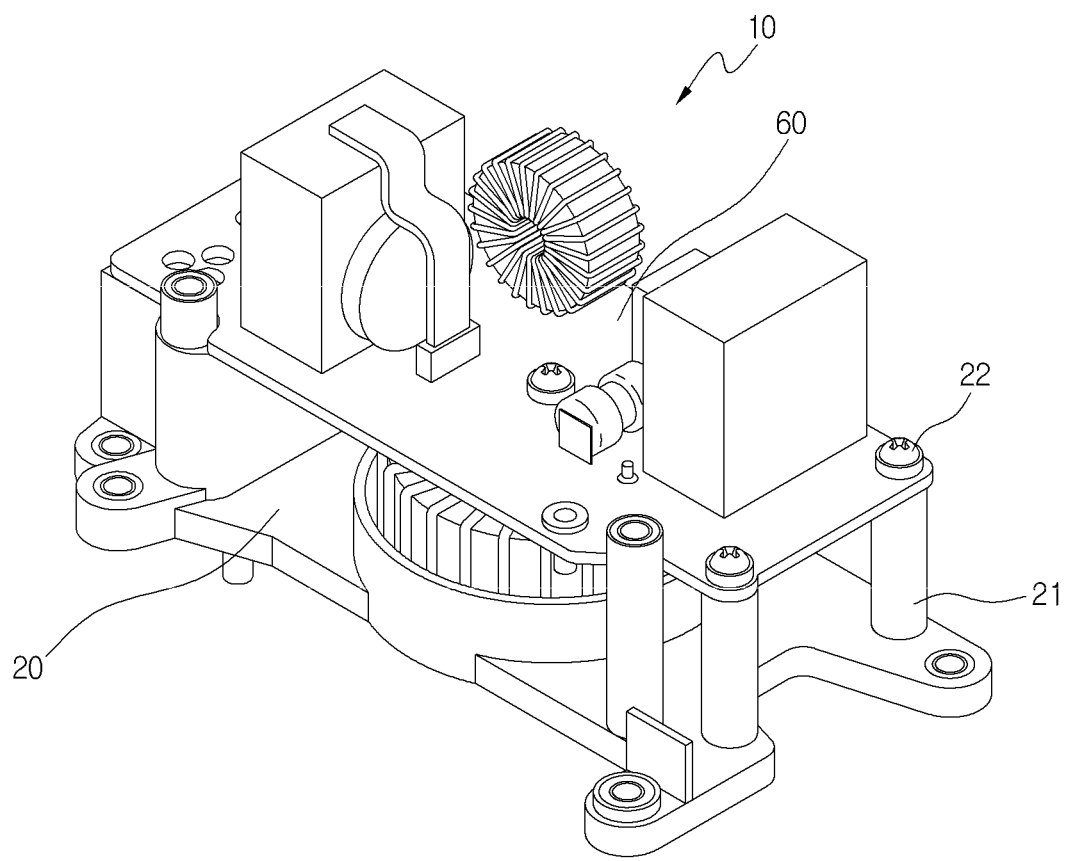
FIG. 1 is a perspective view of a filter assembly according to an embodiment.
Figure 2:
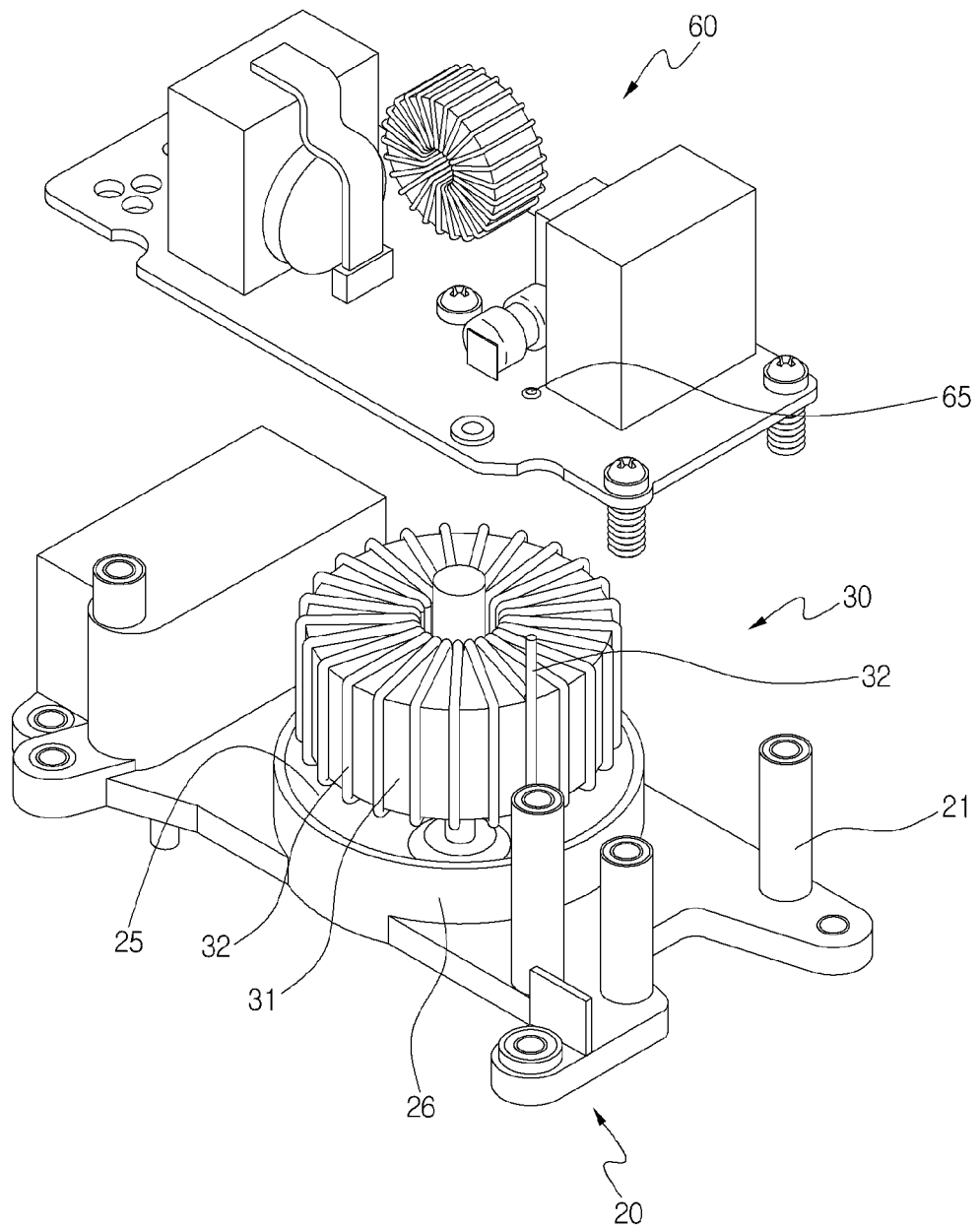
FIG. 2 is an exploded perspective view of the filter assembly according to an embodiment.

FIG. 1 is a perspective view of a filter assembly according to an embodiment. FIG. 2 is an exploded perspective view of the filter assembly according to an embodiment.

Referring to FIGS. 1 and 2, the filter assembly 10 according to an embodiment may include a base 20 disposed at a lower portion thereof and a printed circuit board (PCB) 60 disposed spaced upward from the base 20 and including a plurality of electronic components. The base 20 supports the PCB 60.

The PCB 60 may be coupled to the base 20. For example, the base 20 includes a coupling rib 21 protruding upwardly and a coupling member 22 coupled to the coupling rib 21 to fix the PCB 60 to the base 20. The coupling member 22 may be a screw member. The coupling member 22 may pass through the PCB 60 and then be inserted into the coupling rib 21.

The PCB 60 includes a capacitor, an inductor, a varistor (variable resistor), and a resistor. The electronic components may be provided on the PCB 60. Since the electronic components are well-known in the art, their detailed descriptions will be omitted.

The inductor provided on the PCB 60 is a component different from an inductor 30 that will be described below, i.e., an inductor that performs a function for filtering noises with respect to a predetermined signal (or high frequency signals).

The filter assembly 10 includes the inductor 30 disposed in a space spaced between the base 20 and the PCB 60. The inductor 30 includes a core 31 which is a magnetic core and a coil 32 wound around an outer circumferential surface of the core 31. When current is applied to the coil 32, a strong electromagnet field is generated around the core 31 or the coil 32.

The base 20 includes a seating part 26 on which the inductor 30 is seated. The seating part 26 protrudes upward from one surface of the base 20 to form a seating space therein. Here, the PCB 60 is disposed spaced upward from the seating part 26.

Also, a fixing part 25 for fixing the inductor 30 to the base 20 is provided within the seating part 26. For example, the fixing part 25 may be formed by curing a liquid epoxy resin.

In detail, the inductor 30 may be disposed on the seating part 26, and then, the liquid epoxy resin may be filled within the seating part 26. Also, when the liquid epoxy resin is cured, the inductor 30 may be securely fixed to the seating part 26 by the fixing part 25.

The inductor 30 may be a heavy component of the filter assembly 10. According to the current embodiment, since the inductor 30 is disposed under the PCB 60, the PCB 60 may not be affected by a physical load of the inductor 30.

A through-hole 65 through which at least one portion of the coil 32 passes may be defined in the PCB 60. The coil 32 passes through the through-hole 65 to extend upward from the PCB 60. This will be described below with reference to the accompanying drawings.

Figure 3:
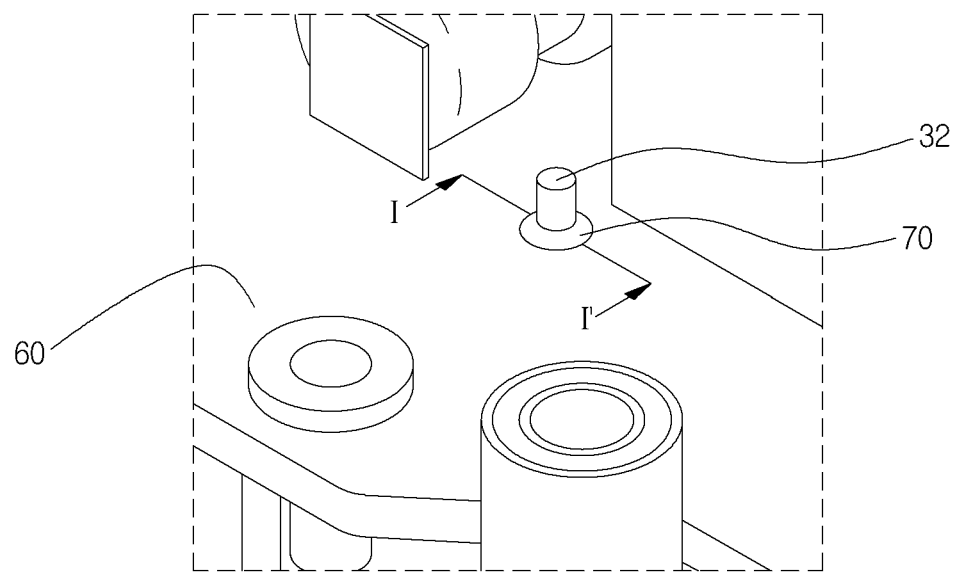
FIG. 3 is a view illustrating a portion of the filter assembly according to an embodiment.
Figure 4:
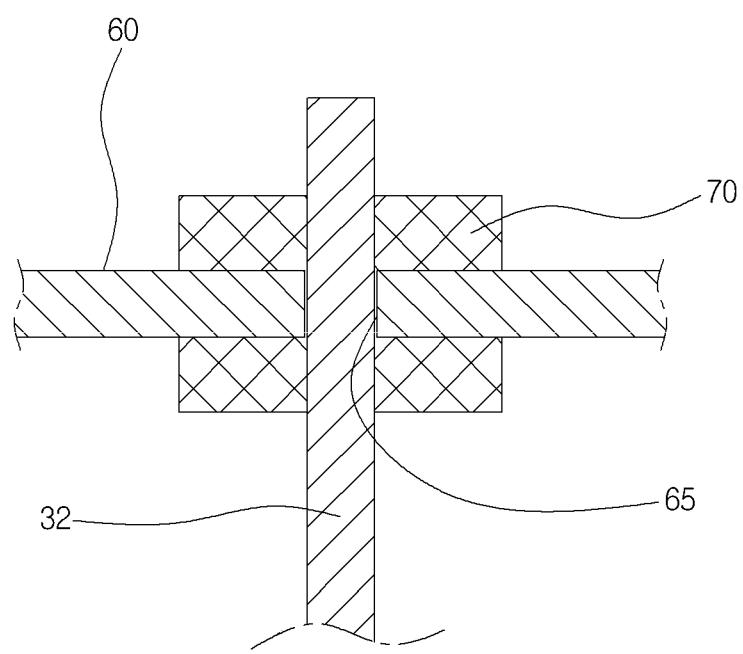
FIG. 4 is a cross-sectional view of a coupled structure between a coil and a printed circuit board (PCB) according to an embodiment.

FIG. 3 is a view illustrating a portion of the filter assembly according to an embodiment. FIG. 4 is a cross-sectional view of a coupled structure between the coil and the PCB according to an embodiment.

Referring to FIGS. 3 and 4, the through-hole 65 through which the coil 32 passes is defined in the PCB 60 according to an embodiment. The through-hole 65 may be defined in a location corresponding to a location at which an end of the coil 32 disposed under the PCB 60 is positioned.

Also, one end of the coil 32 wound around the core 31 extends upward and passes to extend up to an upper side of the PCB 60 via the through-hole 65.

A coupling part 70 for coupling the through-hole 65 to the coil 32 is provided on at least one side of the through-hole 65. The coupling part 70 may be disposed inside or outside the through-hole 65.

For example, the coupling part 70 may be formed by welding or soldering. As shown in FIG. 4, in the case where the coupling part 70 is formed by the soldering, the coupling part 70 may be disposed on an outer portion of the coil 32 passing through the through-hole 65 and each of upper and lower surfaces of the PCB 60.

As described above, a separate member for coupling the inductor 30 to the PCB 60 is not needed. Also, since only the coil 32 of the inductor 30 extends upward and is coupled to the PCB 60, an assembling process may be simplified, and additional costs due to an increase in the number of components may not occur.

Another embodiment will be proposed.

A separate fixing member may be provided on at least one of an end of a coil 32 and a top surface of a PCB 60. Also, in a state where the coil 32 passes through a through-hole 65 to extend upward from the PCB 60, the coil 32 and the PCB 60 may be coupled to each other through the fixing member.

Figure 5:
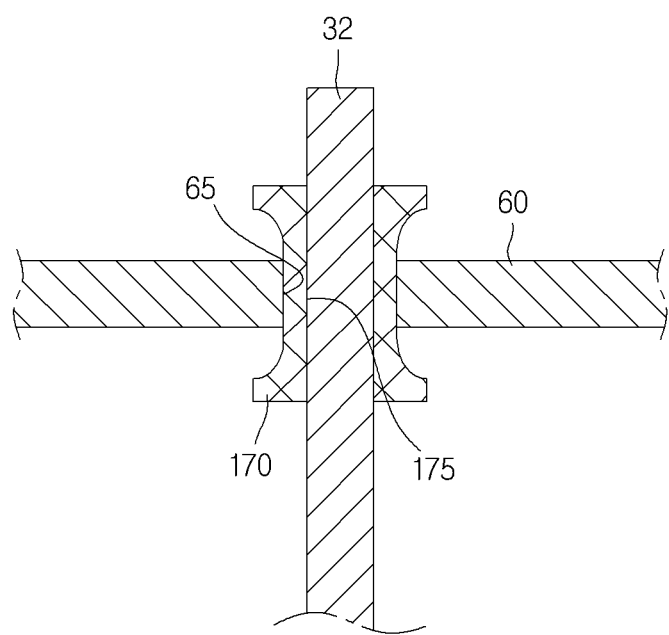
FIG. 5 is a cross-sectional view of a coupled structure between a coil and a PCB according to another embodiment.

FIG. 5 is a cross-sectional view of a coupled structure between the coil and the PCB according to another embodiment.

Referring to FIG. 5, a filter assembly according to another embodiment includes a coupling part 170 coupled to the coil 32 and inserted into the through-hole 65. The coupling part 170 is provided as the separate fixing member.

In detail, a coupling hole 175 in which the coil 32 is inserted may be defined in the coupling part 170. The coupling hole 175 may pass from an upper end of the coupling part 170 up to a lower end of the coupling part 170. In the state where the coil 32 is fitted into the coupling hole 175, the coil 32 extends upward.

In the state where the coupling part 170 is fitted outside the coil 32, the coupling part 170 may be disposed to pass through the through-hole 65 of the PCB 60.

The coupling part 170 may be an elastic member. The coupling part 170 may be closely attached and coupled to the coil 32 by an elastic force of the coupling part 170. The coupling part 170 may be closely attached and coupled to the through-hole 65.

According to the embodiments, since the coil of the inductor is disposed to pass through the PCB and directly coupled to the PCB, the assembling process may be simplified.

Also, since the fixing member for coupling the coil of the inductor to the PCB is not needed, the costs for manufacturing the filter assembly may be reduced.

Also, since the inductor which is the heavy component of the filter assembly is disposed under the PCB, the physical load applied to the PCB may be reduced.

Also, since the inductor is fixed to the base through the molding, the inductor may be easily fixed.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A filter assembly comprising:
  a printed circuit board (PCB) comprising a plurality of electronic components;
  a base disposed under the PCB; and
  an inductor coupled to the base, the inductor comprising a core and a coil to which current is applied,
  wherein the PCB has a through-hole through which at least one portion of the coil passes.

2. The filter assembly according to claim 1, wherein the PCB is disposed spaced apart from the base, and
  the inductor is disposed in a space between the PCB and the base.

3. The filter assembly according to claim 1, wherein the coil extends upward from the PCB via the through-hole.

4. The filter assembly according to claim 1, wherein a coupling part for coupling the coil to the PCB is disposed in the through-hole.

5. The filter assembly according to claim 4, wherein the coupling part is formed by welding or soldering.

6. The filter assembly according to claim 4, wherein the coupling part comprises a fixing member disposed on an end of the coil or a top surface of the PCB to fix the coil to the PCB.

7. The filter assembly according to claim 6, wherein the coupling part comprises a coupling hole in which the coil is inserted, and
  in the state where the coupling part is coupled to the coil, the coupling part passes through the through-hole.

8. The filter assembly according to claim 6, wherein the coupling part comprises an elastic member.

9. The filter assembly according to claim 1, wherein the base further comprises: a seating part on which the inductor is seated; and
  a fixing part disposed within the seating part to fix the inductor to the base.

10. The filter assembly according to claim 9, wherein the fixing part is molded by using an epoxy resin.

11. A filter assembly comprising:
  an inductor comprising a core and a coil to which a current is applied,
  a base comprising a seating part on which the inductor is seated;
  a printed circuit board (PCB) spaced apart from the base;
  a through-hole through which an end of the coil passes, the through-hole being defined in the PCB, and a coupling part disposed in the through-hole to couple the coil to the PCB.

12. The filter assembly according to claim 11, further comprising:
    a coupling rib extending from the base; and
    a coupling member coupled to the coupling rib to fix the PCB to the base.

13. The filter assembly according to claim 11, wherein the coupling part is a welded part.

14. The filter assembly according to claim 11, wherein the coupling part comprises an elastic member coupled to the coil and disposed to pass through the through-hole.

15. The filter assembly according to claim 11, further comprising a fixing part disposed within the seating part and formed of an epoxy resin to fix the inductor.

* * * * *